United States Patent [19]

Uggowitzer

[11] Patent Number: 4,766,268

[45] Date of Patent: Aug. 23, 1988

[54] BOARD FOR PRINTED CIRCUITS AND PROCESSES FOR MANUFACTURING SUCH PRINTED BOARDS

[75] Inventor: Werner Uggowitzer, Ferlach, Austria

[73] Assignee: U.S. Philips Corporation, New York, N.Y.

[21] Appl. No.: 27,751

[22] Filed: Mar. 19, 1987

[30] Foreign Application Priority Data

Mar. 25, 1986 [AT] Austria ............................. 791/86

[51] Int. Cl.⁴ ........................... H05K 1/00; H05K 3/00
[52] U.S. Cl. ..................................... 174/68.5; 29/846;
427/96; 427/259; 427/264
[58] Field of Search .................... 174/68.5; 156/902;
29/846; 427/96, 259, 264

[56] References Cited

U.S. PATENT DOCUMENTS

| | | | |
|---|---|---|---|
| 4,064,287 | 12/1977 | Lipson et al. | 427/259 X |
| 4,088,828 | 5/1978 | Yamamoto et al. | 174/68.5 |
| 4,104,111 | 8/1978 | Mack | 156/902 X |
| 4,220,810 | 9/1980 | Arai et al. | 174/68.5 |
| 4,390,615 | 6/1983 | Courtney et al. | 427/259 X |
| 4,413,309 | 11/1983 | Takahashi et al. | 174/68.5 X |
| 4,479,983 | 10/1984 | Appelt et al. | 427/96 X |

FOREIGN PATENT DOCUMENTS 1187282  2/1965  Fed. Rep. of Germany ..... 174/68.5

Primary Examiner—Morris H. Nimmo
Attorney, Agent, or Firm—Norman N. Spain

[57] ABSTRACT

A printed circuit board, in which the substrate (1) and interconnections (2) are masked by a solder-resistant lacquer mask consisting of two layers of lacquer (4,5), the lands (3) being left unmasked, one layer of lacquer (4), which extends to the edges of the lands (3) and directly masks the substrate (1), is provided at least in the region of the lands (3), and the other layer of lacquer (5) masks the interconnections (2), while leaving the lands (3) unmasked, and extends to the region occupied by the layer of lacquer (4) extending to the edges of the lands (3) the two layers overlapping.

7 Claims, 2 Drawing Sheets

BOARD FOR PRINTED CIRCUITS AND PROCESSES FOR MANUFACTURING SUCH PRINTED BOARDS

BACKGROUND OF THE INVENTION

The invention relates to a printed circuit board in which the desired interconnections and solder lands are provided in the form of electrically conductive sections on a substrate comprising a board of insulating material (the substrate) and in which the substrate and the interconnections, but not the lands, are masked with a solder-resistant lacquer mask, the lacquer mask consisting of two layers of lacquer, one layer of which covers at least part of the other layer. In such a printed circuit board, proposed in the U.S. Pat. No. 4,088,828, the lacquer mask is so constructed that it also masks parts of the lands in the region of their edges. In this case the lacquer mask consists of a layer of lacquer masking the substrate, the interconnections and the aforementioned edges of the lands, with an additional layer of lacquer on top of it, which is applied at those regions of the printed circuit board where the lands are positioned very close together. This further layer of lacquer, which is higher with respect to the first-mentioned layer of lacquer and forms a wall between two adjacent lands, is meant to prevent any solder bridges from forming between the adjacent lands during the soldering process. With such a lacquer mask, i.e. one which also masks parts of the lands, it is important that the lacquer mask be applied with an extremely high degree of precision so as to ensure that those regions of the lands where the soldering process is meant to take place have in fact been left unmasked, thus creating a reliable soldering junction. However, the need for such a high degree of precision in applying the lacquer mask gives rise in practice to considerable problems and requires complex and expensive methods for applying the lacquer mask. On the other hand, lacquer masks consisting of a single layer of lacquer have been applied in such a way that they extend to the edges of the lands while masking the interconnections, as shown in the DE-Patent Application No. 29 37 886. Here too the application of the lacquer mask requires a high degree of precision and therefore is again complex and expensive. With a view to obviating these difficulties, single-layer lacquer masks, as known generally, are often applied in such a way that they surround the lands with a relatively large interspace in order to leave them unmasked. However, this has the disadvantage that the regions of the substrate situated between the edge of the lands and the edge of the lacquer mask are not masked.

SUMMARY OF THE INVENTION

It is an object of the invention to provide a printed circuit board of the type referred to in the opening paragraph, constructed in such a way that, while guaranteeing that the entire area of the lands is left unmasked, both the substrate and the interconnections are flawlessly masked. For this purpose, according to the invention, lacquer layer extending to the edges of the electrically conductive sections and directly masking the substrate is provided at least in the region of the lands and the other lacquer layer leaving the lands unmasked, masks the interconnections and extends to the region occupied by the lacquer layer extending to the edges of the electrically conductive sections, the two layers overlapping. In this manner one layer of lcaquer ensures that the substrate is masked up to the edges of the lands, and the other layer of lacquer, leaving the lands unmasked, ensures that the interconnections are masked, the overlap of the two lacquer layers lacquer thus guaranteeing that all parts of the substrate, too, are flawlessly masked. In this case the lands are left unmasked by allowing a relatively large interspace between the edge of the lands and the edge of the lacquer layers masking the interconnections, since in this region the substrate is masked by the first-mentioned lacquer layers. Moreover, the application of the two lacquer layers of lacquer no longer poses any tolerance problems and the degrees of precision to be met are uncritical.

It has proved advantageous if the lacquer layer extending to the edges of the electrically conductive sections extensively masks the substrate and is extensively covered by the other lacquer layer, the lands being left uncovered. In this way the application of the layers of lacquer is made simple and uncritical, and as a result of the extensive overlap of the two lacquer layers the lacquer mask masks the entire printed circuit board flawlessly, while guaranteeing that the lands are left unmasked.

It has also proved advantageous if the other lacquer layer of lacquer, while leaving the lands unmasked, completely masks the interconnections and extensively the substrate and is at least partially covered by the lacquer layer extending to the edges of the electrically conductive sections. This too results in a simple, uncritical application of the layers of lacquer, since the layer of lacquer which leaves the lands uncovered is applied in the usual fashion, surrounding the lands with a relatively large interspace, and the parts of the substrate still unmasked are masked by the layer of lacquer which extends to the edges of the lands, while the layer of lacquer which leaves the lands uncovered is at least partially covered. Here again the printed circuit board is completely masked by the lacquer mask, while guaranteeing that the lands are left unmasked.

The invention further relates to processes for manufacturing the printed circuit boards embying the invention. In these processes the desired interconnections and lands in the form of electrically conductive sections are manufactured on a substrate, whereupon the substrate and the interconnections, though not the lands, are masked with a solder-resistant lacquer mask, as is generally known. It is an object of this aspect of the invention to propose particularly simple processes for manufacturing printed circuit boards embodying the invention.

For this purpose, according to one process of the invention after the interconnections and lands have been manufactured a solder-resistant layer of lacquer which adheres only to the substrate is applied to the substrate and to the electrically conductive sections, at least in the region of the lands, this layer of lacquer is hardened, the hardened layer of lacquer is then removed from the electrically conductive sections by chemical means, after which a further solder-resistant layer of lacquer which adheres indiscriminately is applied so as to partially cover the electrically conductive sections and the layer of lacquer first applied, to leave the lands uncovered and to surround the lands with an interspace, and is then hardened, whereupon the printed circuit board is completed in the usual manner. In this way the application of both layers of lacquer is completely uncritical, since the layer of lacquer first applied entirely covers at least the regions of the lands, so that no problems whatsoever arise with regard to the degree of precision required and when the further layer of lacquer is applied the lands can be left uncovered by maintaining a relatively large safety interspace, so that in this case too there are no special precision requirements. By using two different types of lacquer, of which one adheres only to the substrate and the other indiscriminately, the layer of lacquer formed by the first-mentioned type of lacquer and which covers the electrically conductive sections and, in particular, the lands can again easily be removed by chemical means from the electrically conductive sections and in particular from the lands, thus ensuring that the layer of lacquer remaining extends exactly flush to the edges of the electrically conductive secttions and, in particular, the lands. Such a chemical removal of a layer of lacquer which is called "stripping" is often used in the manufacture of printed circuit boards. The partial overlap of the two layers of lacquer provides a complete mask of the printed circuit board up to the lands.

In a process such as this it has also proved advantageous if after the chemical removal of the layer of lacquer from the electrically conductive sections the remaining layer of lacquer is hardened again. This ensures that the layer of lacquer remaining on the substrate has in fact hardened completely, since the chemical removal of the layer of lacquer from the electrically conductive sections may possibly result in a softening of the remaining layer of lacquer.

According to a second process of the invention it is proposed that after the interconnections and the lands have been manufactured a solder-resistant layer of lacquer which adheres indiscriminately is applied to the substrate and the interconnections, leaving the lands uncovered and surrounded with an interspace, that this layer of lacquer is hardened, that next a further solder-resistant layer of lacquer which, however, adheres only to the substrate and the layer of lacquer first applied and which covers the lands, the parts of the substrate still unmasked and at least partially the layer of lacquer first applied is applied and then hardened and that then the further layer of lacquer is removed by chemical means from the lands, whereupon the printed circuit board is completed in the usual manner. In this way the application of both layers of lacquer is again completely uncritical, since in this case there are no special precision requirements. Moreover, the at least partial overlap of the two layers of lacquer again guarantees that the entire substrate is flawlessly masked and that the further layer of lacquer extends exactly flush to the edges of the lands. For this process it is again essential that two different types of lacquer be used for the two layers of lacquer, of which the layer of lacquer first applied adheres indiscriminately and the further layer of lacquer adheres only to the substrate and to the layer of lacquer first applied, so that the further layer of lacquer covering the lands can again easily be chemically removed from them.

For this process, too, it has proved advantageous if after the chemical removal of the further layer of lacquer from the lands the remaining layer of lacquer is again hardened. This again ensures that the remaining layer of lacquer has hardened completely.

DETAILED DESCRIPTION OF THE INVENTION

The invention will now be described in greater detail with reference to the following embodiments and drawing.

Figure 1:
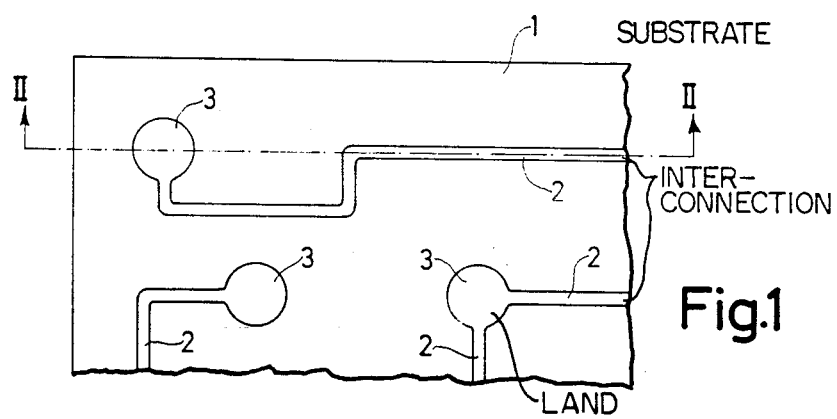
FIG. 1 shows a plan view of a printed circuit board substrate provided with the desired interconnections and lands.
Figure 2:
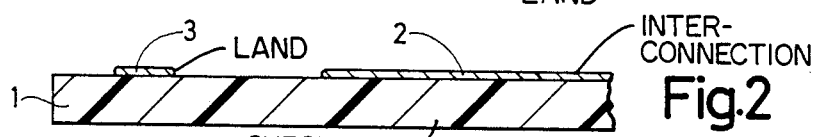
FIG. 2 shows a sectional view, taken along the line II—II in FIG. 1, of the printed circuit board represented in FIG. 1, to illustrate a first process for manufacturing a printed circuit board embodying the invention.
Figure 3:
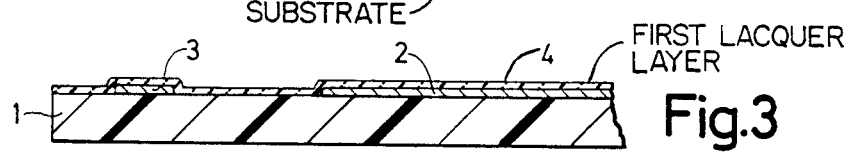
FIG. 3 shows, using the same projection as in FIG. 2, the printed circuit board represented in FIG. 2, after application of a solder-resistant layer of lacquer which adheres only to the substrate.
Figure 6:
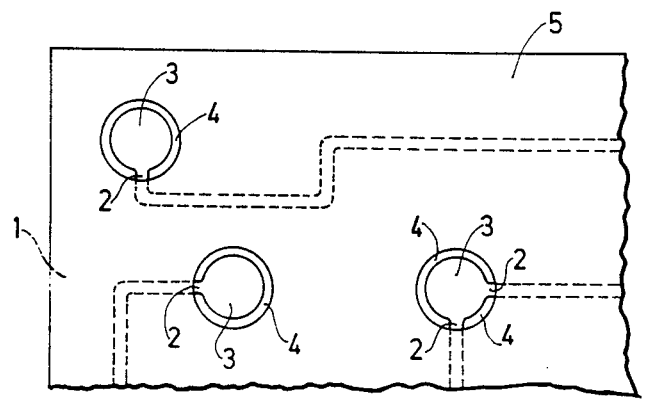
FIG. 6 shows a plan view of the printed circuit board represented in FIG. 5. In order to illustrate a second process for manufacturing a printed circuit board embodying the invention.

In FIGS. 1 and 2, reference 1 denotes a substrate on which various interconnections 2 and lands 3 consisting of electrically conductive sections are provided, which can be formed on the substrate by means of the usual state-of-the-art process. With reference to FIGS. 3 and 6 a process will now be described whereby the substrate 1 and the interconnections 2 are masked with a solder-resistant lacquer mass consisting of two layers of lacquer, with the lands being left unmasked, and whereby one layer of lacquer of the lacquer mask extends directly to the edges of the lands 3, the lands themselves, however, being left completely unmasked. To this end, in a first stage of the process the entire printed circuit board as shown in FIGS. 1 and 2, viz. the substrate, the interconnections and the lands, is coated with a solder-resistant layer of lacquer, which may be carried out, for example, in the course of the known screen-printing process. In fact, however, a photographic printing process, for example, could just as well be used instead. For this layer of lacquer 4, moreover, a type of lacquer is used which adheres only to the substrate and hence does not adhere to the electrically conductive sections, namely the interconnections and the lands 3.

Figure 4:
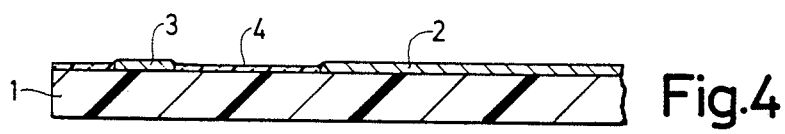
FIG. 4 shows, using the same projection as in FIG. 2, the printed circuit board represented in FIG. 3, after the applied layer of lacquer has been removed chemically from the interconnections and lands.
Figure 5:
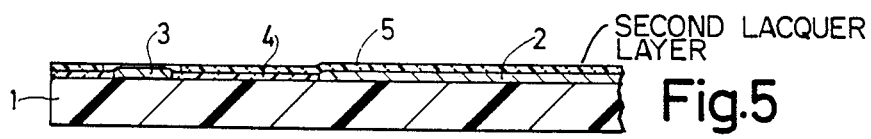
FIG. 5 shows, using the same projection as in FIG. 2, the printed circuit board represented in FIG. 4, afer a further solder-resistant layer of lacquer which adheres indiscriminately has been applied so as to leave the lands uncovered and to substantially cover the interconnections and partially cover the layer of lacquer first applied.

Such lacquers are of a type that, because of their composition, adhers to thermoplastic synthetic resins, but not to metals. Among such synthetic resins are the adhesives which are used to laminate a printed circuit board from an electrically isolating substrate and an electrically conductive foil. The remains of the adhesive, on such parts of the isolating substrate which are free from an electrically conductive coating, provides a strong adhesion of the lacquer layer 4 to the isolating substrate. A solder-resistant lacquer which has such properties is for example commercially available from the firm of Pangolin under type designation 15.89/5 TA. This is a so-called UV-hardening single-component lacquer which is acrylate-based and can be hardened upon irradiation with ultraviolet light, which is in fact done after this layer of lacquer 4 has been applied. In a subsequent stage of the process the layer of lacquer 4 is removed by chemical means from the electrically conductive sections, namely the interconnections 2 and the lands 3, as shown in FIG. 4. Such a chemical removal of the layer of lacquer, also termed stripping in printed circuit board technology, can be carried out by immersing the printed circuit board for a certain period in a bath containing potassium hydroxide or sodium hydroxide.

In this process the lacquer layer 4 is removed much faster at places where it does not adhere, therefore on the electrically conductive parts, than at places where it adheres strongly, thus making it possible to free the electrically conductive parts from the lacquer layer. After this the layer of lacquer 4, which now remains only on the substrate 1, should preferably be hardened again so as to restrengthen any regions of this layer of lacquer that may have softened during the chemical treatment.

In this way the layer of lacquer 4 coating the substrate 1 extends exactly flush to the edges of the electrically conductive sections, and in particular to the lands 3. Clearly, the application of the layer of lacquer 4 is completely uncritical since it is simply applied extensively to the entire printed circuit board. In fact, however, it would also be possible to apply the layer of lacquer 4 only in the region of the respective lands 3, thus saving lacquering material. In this case too the application of the layer of lacquer 4 would be completely uncritical since the lacquered regions could surround the lands 3 with a fairly large interspace and could possibly also merge into one another and thus join up.

In a subsequent stage of the process a further solder-resistant layer of lacquer 5 is now applied, which partially covers the remaining electrically conductive sections, namely the essential parts of the interconnections 2 and the layer of lacquer 4 first applied, leaving the lands 3 uncovered and surrounded by this layer of lacquer 5 with an interspace. This layer of lacquer 5 thus masks the interconnections 2 up to the regions around the lands 3. For this solder-resistant layer of lacquer 5, moreover, a type of lacquer is applied such as is commonly used in the art for solder-resistant layers and which adheres indiscriminately, in other words adheres to the interconnections 2 and to the layer of lacquer 4 first applied. A solder-resistant lacquer which has such properties is for example commercially available from the firm of Dynachem under type designation SM 15 LV. This too is a UV-hardening single-component lacquer which is acrylate-based and can be hardened upon irradiation with ultraviolet light, which is in fact carried out after this layer of lacquer 5 has been applied.

Clearly, the application of the layer of lacquer 5, which can be done, for example, in the course of the screen-printing process, is also completely uncritical as regards applicable tolerances, since the layer of lacquer 5 can surround the lands 3 with a relatively large interspace, so that there are no special precision requirements for applying this layer of lacquer 5. It is possible for the layer of lacquer 5 to surround the lands 3 in this way, with a relatively large interspace, because in this region the substrate 1 is already masked by the solder-resistant layer of lacquer 4 and is thus protected. In this way only the lands 3 are kept completely unmasked by lacquer material. On the other hand, as a result of the overlap of the two layers of lacquer 4 and 5, the remaining parts of the printed circuit board are, as desired, completely and flawlessly masked by the lacquer mask. The manufacturing process is very simple, moreover, since no special precision requirements need be met when applying the layers of lacquer. As a consequence of the extensive application of the two layers of lacquer 4 and 5 they are easily applied, and as a consequence of the extensive overlap which thus ensues between the two layers of lacquer a particularly flawless masking of the printed circuit board, right up to the lands, is achieved by the lacquer mask.

After the solder-resistant layer of lacquer 5 has been applied and hardened the printed circuit board is then completed in the usual manner. In the course of this completion process the printed circuit board can be provided with printing, the lands can be rid of oxide layers, a protective coat of lacquer can be applied and the mechanical operations, such as drilling or punching the feedthrough holes, can be carried out.

Figure 7:
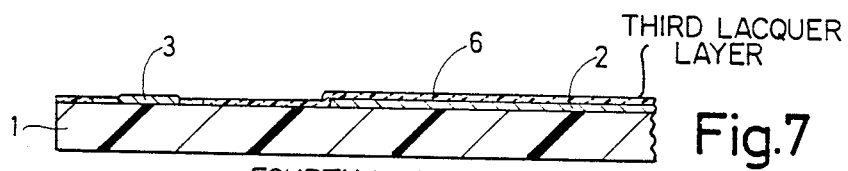
FIG. 7 shows, using the same projection as in FIG. 2, the printed circuit board represented in FIG. 2, with a solder-resistant layer of lacquer which leaves the lands uncovered and which adheres indiscriminately.

A second process for manufacturing a printed circuit board provided with a solder-resistant lacquer mask which in the region of the lands extends to their edges is again based on a printed circuit board as represented in FIGS. 1 and 2, in which the interconnections 2 and the lands 3 are provided in the form of electrically conductive sections on a substrate 1. On such a printed circuit board a third solder-resistant layer of lacquer 6 which adheres indiscriminately is applied to the substrate 1 and to the interconnections 2 while leaving the lands unmasked, and thus surrounds the lands 3 with an interspace, as shown in FIG. 7. The interspace between the edge of the lands 3 and the edge of the layer of lacquer 6 surrounding the lands 3 is selected so as to be relatively large, so that the application of this layer of lacquer 6 is completely uncritical and not subject to any special precision requirements. It is thus a matter of applying a solder-resistant layer of lacquer using a generally known technique.

Figure 8:
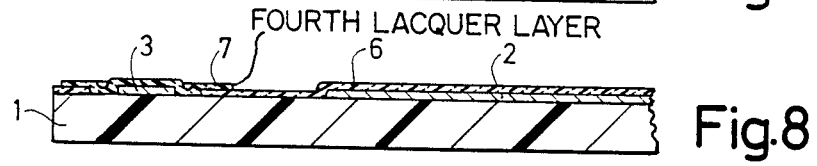
FIG. 8 shows, using the same projection as in FIG. 2, the printed circuit board represented in FIG. 7, provided with a further layer of lacquer which adheres only to the substrate and to the layer of lacquer first applied and which covers the lands, the parts of the substrate still unmasked and, partially, the layer of lacquer first applied.

After this layer of lacquer 6 has been hardened, a fourth solder-resistant layer of lacquer 7 is applied which, however, adheres only to the substrate 1 and to the layer of lacquer 6 first applied and which covers the parts of the substrate 1 still unmasked and covers at least partially the layer of lacquer 6 first applied, as shown in FIG. 8.

Figure 9:
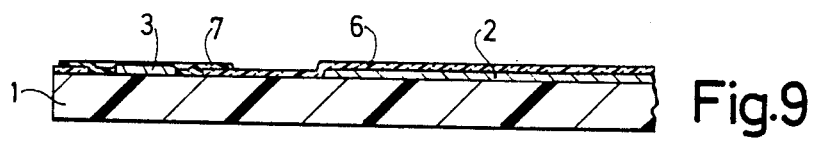
FIG. 9, shows, using the same projection as in FIG. 2, the printed circuit board represented in FIG. 8, after the further layer of lacquer has been removed from the lands by chemical means.
Figure 10:
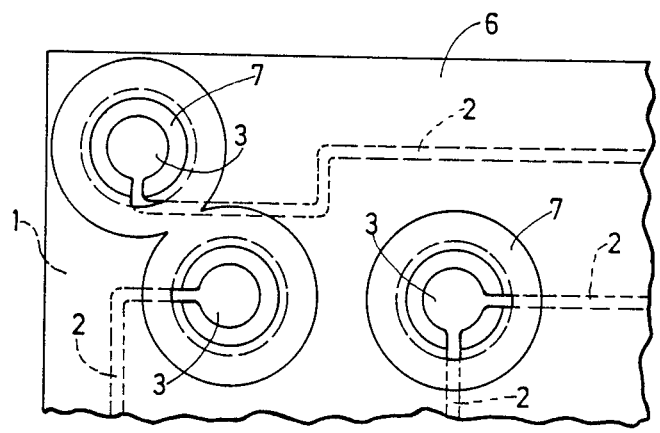
FIG. 10 shows a plan of the printed circuit board represented in FIG. 9.

The choice of the lacquer for the lacquer layer 7 is made from the same viewpoints as the choice of the lacquer layer 4 in the process described before. The exclusive adhesion of the lacquer layer 7 with the isolating substrate 1 and the first applied lacquer layer 6 is attained by the use of a type of lacquer that adheres to thermoplastic synthetic resins, which includes the lacquers usually applied in the art for the lacquer layer 6, but does not adhere to metals. In the present embodiment of the invention this layer of lacquer 7 is applied only in the region of the lands 3 in order to save lacquering material. If preferred, however, the entire printed circuit board as shown in FIG. 7 could be masked extensively with the layer of lacquer 7. After the layer of lacquer 7 has been hardened this further layer of lacquer is removed by chemically treating the lands 3 as described earlier, which again is made possible by the fact that for this layer of lacquer 7 a type of lacquer is used which adheres only to the substrate 1 and to the layer of lacquer 6 first applied, and therefore does not adhere to the parts of the electrically conductive sections not masked by the layer of lacquer 6, in this case substantially the lands 3. The printed circuit board obtained in this manner is shown in FIGS. 9 and 10.

Hardening should preferably be carried out again after the chemical treatment in order to guarantee that the remaining layer of lacquer 7 has hardened completely. Following this the printed circuit board is completed in the usual manner.

In this way one layer of lacquer of the lacquer mask, in this case the further layer of lacquer 7, again extends exactly flush to the edges of the lands 3 and furthermore, owing to the at least partial overlap of the two layers of lacquer 6 and 7, the remaining parts of the printed circuit board are flawlessly masked. Clearly, the application of the two layers of lacquer 6 and 7 is again completely uncritical, since in this case there are no special precision requirements to be met, so that this process for manufacturing the printed circuit board is also shown to be very simple.

What is claimed is:

1. A printed circuit board comprising electrical interconnections and solder lands provided in the form of electrically conductive sections on a substrate comprising a board of insulating material and a solder-resistant lacquer mask, consisting of two lacquer layers masking the substrate and the interconnections but not the lands, one of said lacquer layers at least partially covering the other lacquer layer, characterized in that one of said lacquer layers directly masks the substrate and extends to the edges of the electrically conductive sections, at least in the region, adjacent to the lands while leaving the lands, uncovered and said other lacquer layer masks the interconnections, extends to the region occupied by the lacquer layer extending to the edges of the electrically conductive sections and leaves the lands uncovered, said lacquer layers overlapping at least at the edges of said electrically conductive sections.

2. A printed circuit board as claimed in claim 1, characterized in that the lacquer layer extending to the edges of the electrically conductive sections extensively masks the substrate and is extensively covered by the other lacquer layer, the lands being left uncovered.

3. A printed circuit board as claimed in claim 1, characterized in that the lacquer layer (5) which leaves the lands uncovered and masks the interconnections and the substrate at least partially covers the lacquer layer (4) extending to the edges of the electrically conductive sections.

4. A process for manufacturing a printed circuit board comprising a substrate comprising a board of insulating material, desired electrical conductive interconnections and lands in the form of electrically conductive sections provided on said substrate and a solder-resistant lacquer mask masking the interconnections and the substrate but not the lands, said process comprising, after providing the interconnections and lands on the substrate, applying to the substrate and the interconnections at least in the region of the lands, a first lacquer layer (4), and which adheres only to the substrate, hardening said first lacquer layer, removing said first hardened lacquer layer from said lands and interconnections by chemical means, applying a second solder-resistant lacquer layer (5), said second lacquer layer adheres to said substrate, to said interconnections and to said lands to partially cover the interconnections, and said hardened first lacquer layer, at least in the region of said lands, so as to leave the lands partially uncovered and spaced from the substrate, hardening said second solder-resist solder lacquer and then completing the manufacture of the printed circuit board in the usual manner.

5. The process as claimed in claim 4, characterized in that after the chemical removal of the first lacquer layer (u) from the electrically conductive sections the remaining portion of the first lacquer layer is hardened again.

6. A process for the manufacture of a printed circuit comprising a substrate comprising a board of insulating material, desired electrical interconnecting and lands in the form of electrically conductive sections provided on said substrate and a solder-resistant lacquer mask masking the interconnections and the substrate but not the lands, said process comprising, after providing the interconnections and lands on the substrate, applying to the substrate and the interconnections a first lacquer layer which layer adheres to said substrate, said interconnections and said lands while leaving the lands unmasked and separated from said substrate by said first lacquer layer, hardening said first lacquer layer, applying to any unmasked parts of said substrate, to at least part of said hardened first lacquer layer and to said lands a second solder-resistant lacquer layer (7) which adheres only to said substrate and to said hardened first lacquer layer, hardening said second lacquer layer, removing said second lacquer layer from said lands by chemical means and completing the manufacture of the printed circuit board in the usual means.

7. The process as claimed in claim 6, characterized in that after the chemical removal of the second lacquer layer (5) from the lands the remaining portions of the second lacquer layer is again hardened.

* * * * *